United States Patent [19]
Holcomb

[11] Patent Number: 5,115,189
[45] Date of Patent: May 19, 1992

[54] ANTI-ALIASING DITHERING METHOD AND APPARATUS FOR LOW FREQUENCY SIGNAL SAMPLING

[75] Inventor: Matthew S. Holcomb, Colorado Springs, Colo.

[73] Assignee: Hewlett-Packard Company, Palo Alto, Calif.

[21] Appl. No.: 651,694

[22] Filed: Feb. 6, 1991

[51] Int. Cl.$^5$ .............................................. G01R 13/20
[52] U.S. Cl. ................................ 324/121 R; 340/703; 341/122
[58] Field of Search ................. 324/121 R; 340/703, 340/798; 341/122; 364/724.01, 724.04, 728.03

[56] References Cited

U.S. PATENT DOCUMENTS

| | | | |
|---|---|---|---|
| 3,456,189 | 7/1969 | Hornak | 324/121 |
| 4,553,221 | 11/1985 | Hyatt | 369/724.05 |
| 4,578,667 | 3/1986 | Hollister | 341/122 |
| 4,621,217 | 11/1986 | Saxe et al. | 315/1 |
| 4,694,244 | 9/1987 | Whiteside et al. | 324/121 R |
| 4,719,416 | 1/1988 | Desautels | 324/121 R |
| 4,736,239 | 4/1988 | Sprague et al. | 340/703 |
| 4,809,189 | 2/1989 | Batson | 324/121 R |
| 4,918,637 | 4/1990 | Morton | 364/724.17 |
| 4,985,848 | 1/1991 | Pfeiffer et al. | 364/518 |

Primary Examiner—Kenneth A. Wieder
Assistant Examiner—William J. Burns

[57] ABSTRACT

A method and apparatus is disclosed to prevent aliasing while sampling a low frequency analog input signal. A clock produces a series of electrical pulses at a predetermined frequency $F_o$. An analog-to-digital ("A/D") converter samples the input signal at each clock pulse. Sample selection means randomly select one clock pulse from each successive series of N clock pulses, where N is a predetermined integer much greater than one. A memory receives the digital output values from the A/D converter, but only stores the current digital output value at each selected clock pulse. As a result, the long-term average frequency of sample storage is substantially equal to $F_o/N$, but the interval between successive samples is random (i.e. the interval between successive samples is typically not equal to N clock pulses).

11 Claims, 6 Drawing Sheets

| DECREMENTER VALUE | 5 4 3 2 1 0 | 5 4 3 2 1 0 | 5 4 3 2 1 0 | ... |
|---|---|---|---|---|
| TERMINAL COUNT | 0 0 0 0 0 1 | 0 0 0 0 0 1 | 0 0 0 0 0 1 | ... |
| RANDOM TARGET | 3 3 3 3 3 3 | 5 5 5 5 5 5 | 1 1 1 1 1 1 | ... |
| EQUALITY DETECTOR OUTPUT | 0 0 1 0 0 0 | 1 0 0 0 0 0 | 0 0 0 0 1 0 | ... |

ANTI-ALIASING DITHERING METHOD AND APPARATUS FOR LOW FREQUENCY SIGNAL SAMPLING

BACKGROUND OF THE INVENTION

1. Field of the Invention

The present invention relates generally to the field of signal sampling. More specifically, the present invention discloses a method and apparatus to address a problem known as "aliasing" commonly found in low frequency signal sampling (e.g. in digital oscilloscopes) in which the digitized output signal bears no real relationship to the actual input signal.

2. Statement of the Problem

FIG. 2 shows a block diagram of a typical oversample digitization architecture found in any of number of applications, including many existing digital oscilloscopes. The master clock 10 generates a clock frequency of $F_o$. This signal is connected to the clock input of an analog-to-digital converter ("A/D") 12. The analog input signal, $A_i$, is therefore digitized at a sample rate of $F_o$ samples per second, determined by the frequency of the master clock 10. However, only a fraction of these samples are to be stored into the memory 16. To accomplish this, a "Divide By N" block 14 is inserted between master clock 10 and the memory 16. Therefore, samples are stored into the memory 16 at a rate of 1/Nth of the master clock frequency. For example, FIG. 3 demonstrates sampling with $N = 100$, which results in every 100th sample (i.e. samples $S_0$, $S_{100}$, $S_{200}$, etc.) being stored in the memory 16. FIG. 5 shows another version of the prior art in which $N = 4$.

Unfortunately, when using this prior art approach, signal aliasing can easily occur, especially when the effective store frequency is relatively near a harmonic of the input frequency. For example, consider the following:

Master Clock Frequency = $F_o = 10^6$ samples/sec.

Store Freq. = 10000 samples/sec. ($N = 100$)

Input Signal = A sine wave whose frequency differs from the store frequency by 0.1%. (e.g. 10 KHz + 10 Hz, or 10,010 Hz).

In other words, $A_i = \sin((10{,}010 * 2 * pi * t)$. The signal stored into memory is $A_i$ evaluated at time 0, 1/10000 sec., 2/10000 sec., 3/10000 sec., etc. This reduces to $\sin(10*2*pi*t)$, which is a sine wave having a frequency of 10 Hz, not 10.01 KHz! This condition is commonly known as aliasing—when the digitized output signal bears no real relationship to the actual input signal. Such a condition could have catastrophic consequences, especially in a digital feedback loop. One possible solution would be to add circuitry to bandwidth limit the input signal below the Nyquist limit (as calculated from the effective store frequency) before it is digitized. Unfortunately, this introduces undesirable added complexity and cost. Worse yet, this approach may also cause erroneous output signals. For example, in digital oscilloscopes, it would be quite unacceptable to bandwidth limit the input signal (e.g. to 1 KHz) at the slowest sweep speeds. This would result in higher frequency input signals (e.g. a 1 MHz input signal) being displayed simply as a DC input, which is certainly very far from accurate.

SOLUTION TO THE PROBLEM

The present invention addresses this problem of aliasing by sampling the input signal at a frequency of $F_o$ samples per second, and then randomly selecting and storing only one sample from each successive series of N samples, where N is a predetermined integer much larger than one. This results in a long-term average sample frequency of $F_o/N$, but the spacing between each successive pair of samples is random to substantially reduce the possibility of aliasing.

SUMMARY OF THE INVENTION

This invention provides a method and apparatus to prevent aliasing while sampling a low frequency analog input signal. A clock produces a series of electrical pulses at a predetermined frequency $F_o$. An analog-to-digital ("A/D") converter samples the input signal at each clock pulse. Sample selection means randomly select one clock pulse from each successive series of N clock pulses, where N is a predetermined integer much greater than one. A memory receives the digital output values from the A/D converter, but only stores the current value at each selected clock pulse. As a result, the long-term average frequency of sample storage is substantially equal to $F_o/N$, but the interval between successive samples is random (i.e. the interval between successive samples is typically not equal to N clock pulses).

A primary object of the present invention is to provide a method and apparatus to substantially reduce the possibility of aliasing.

Another object of the present invention is to provide a method and apparatus to reduce the potential for aliasing that can be readily and economically adapted for use in digital oscilloscopes.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 2:
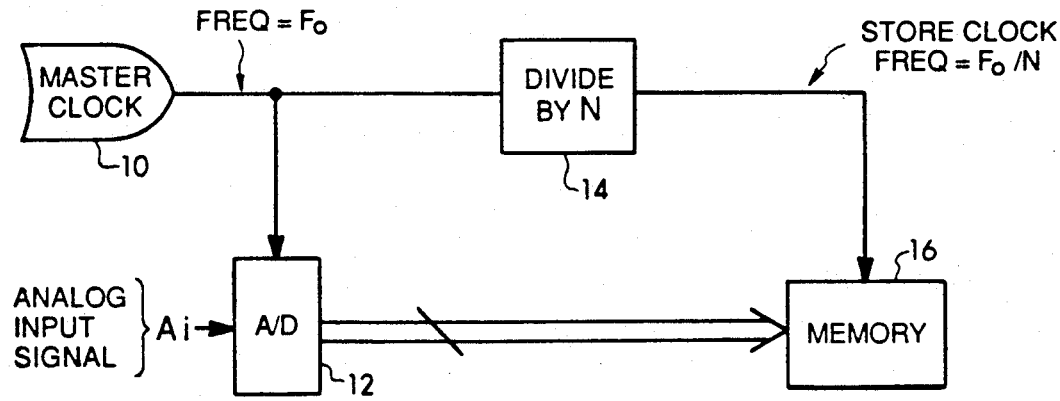
FIG. 2 is a schematic block diagram of a prior art circuit for oversample digitization of an analog input signal.

FIG. 2 provides a block diagram of a conventional approach to input signal sampling commonly used in digital oscilloscopes. A master clock 10 generates a series of clock pulses having a predetermined frequency $F_o$. An analog-to-digital ("A/D") converter 12 samples the analog input signal $A_i$ at each clock pulse and outputs a digital value representative of the input signal. A divide-by-N block 14 outputs one pulse for each series of N clock pulses, where N is a predetermined integer greater than one. A memory 16 receives the digitalized samples from the A/D converter 12 and is adapted to store a plurality of these samples in a predetermined protocol for subsequent processing and display. However, the memory 16 only stores the current sample when triggered by an output pulse from the divide-by-N block 14.

Figure 5:
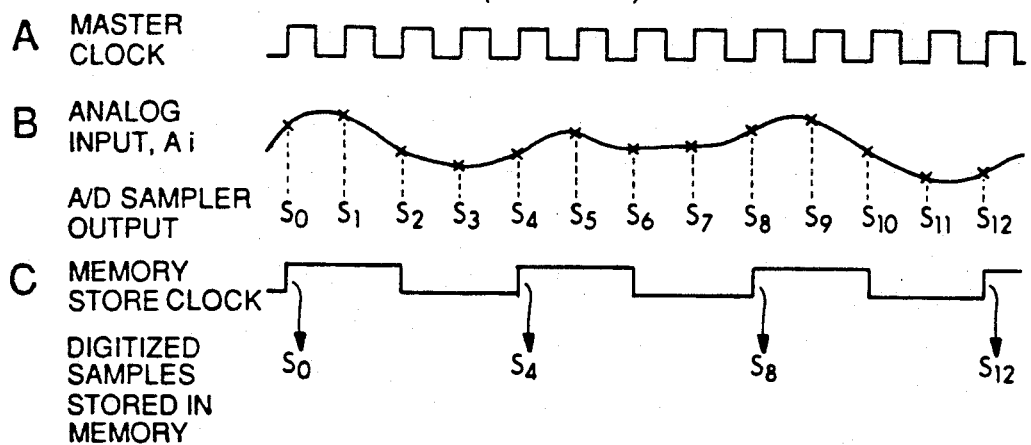
FIG. 5 is a timing diagram showing sampling and storage of data for $N = 4$ in the prior art embodiment of FIG. 2.

FIG. 5 demonstrates the manner in which the input signal $A_i$ is sampled and stored for N = 4 in the prior art embodiment of FIG. 2. The input signal is sampled and digitized ($S_0, S_1, S_2, \ldots$) by the A/D converter 12 at the master clock frequency $F_o$. The divide-by-N block 14 outputs one pulse at the beginning of each series of 4 clock pulses. This causes the memory 16 to store a sample (i.e., $S_0, S_4, S_8, \ldots$) at the beginning of each series of 4 clock pulses, but to ignore the remaining 3 samples in each series. Therefore, the spacing between successive samples stored by the memory 16 is a uniform temporal interval of 4 clock pulses. FIG. 2 provides another example for N = 100. This results in one sample (i.e. $S_0, S_{100}, S_{200} \ldots$) being stored in the memory 16 at the beginning of each series of 100 clock pulses. The remaining 99 samples (i.e., $S_1 - S_{99}, S_{101} - S_{199}, \ldots$) in each series are ignored by the memory 16.

In the context of a digital oscilloscope, the oversampling rate, N, is determined as a function of the clock frequency $F_o$, the number of pixels P (or data points to be plotted) along the x-axis of the oscilloscope display, and the sweep rate of the oscilloscope display (i.e. the display is updated at a rate of S sweeps along the x-axis per unit time). Given these set-up parameters, the oversampling rate, N, is typically equal to $F_o/(S * P)$. This results in storage of one sample for each pixel (or data point) along the x-axis in each sweep.

Figure 1:
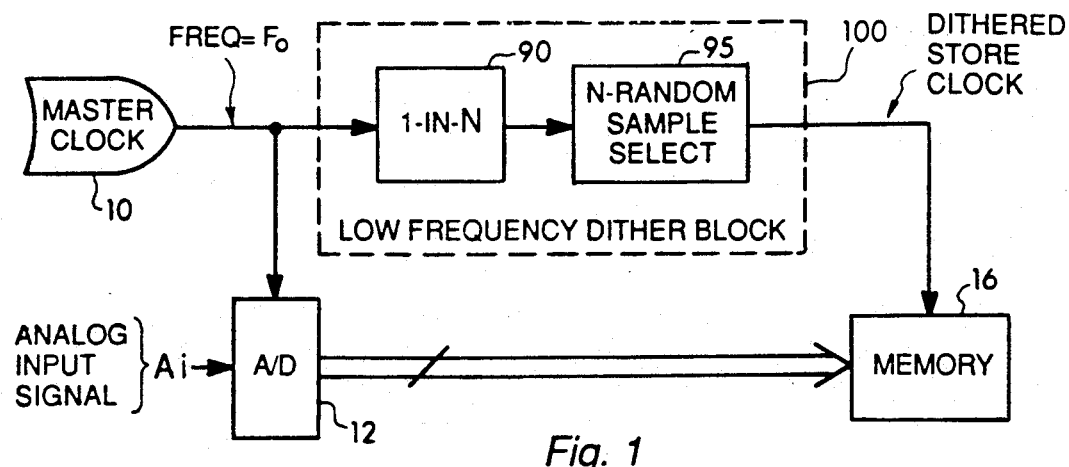
FIG. 1 is a schematic block diagram of the present invention.

Turning to FIG. 1, an overall system block diagram of the present invention is presented. The major difference over the prior art is the low frequency dither block 100 which has been substituted for the divide-by-N block 14 in FIG. 2. This block is used to randomly dither the rate at which the digitized samples from the A/D converter 12 are stored into the memory 16. (The remaining blocks in FIG. 1 are substantially the same as in FIG. 2 and function as described above.) The 1-in-N block 90 outputs a signal that is a one for a single clock pulse, and then zero for N − 1 clock pulses. These output pulses are equally spaced in time. The random sample select block 95 takes these equally spaced pulses and effectively delays each pulse by a random or arbitrary period of time between zero and N − 1 clock cycles. Thus, the dithered store clock pulses produced by the random sample select block 95 are not equally spaced in time (i.e., time-dithered), yet they still have a long-term average frequency of $F_o/N$ cycles per second.

To summarize, rather than storing samples that are equally spaced in time as was the case in FIG. 2, the samples stored into the memory 16 are now separated by random time intervals. In other words, the long-term average storage rate of samples into the memory 16 is still equal to $F_o/N$, but the interval between successive stored samples is typically not equal to N clock pulses.

Figure 3:
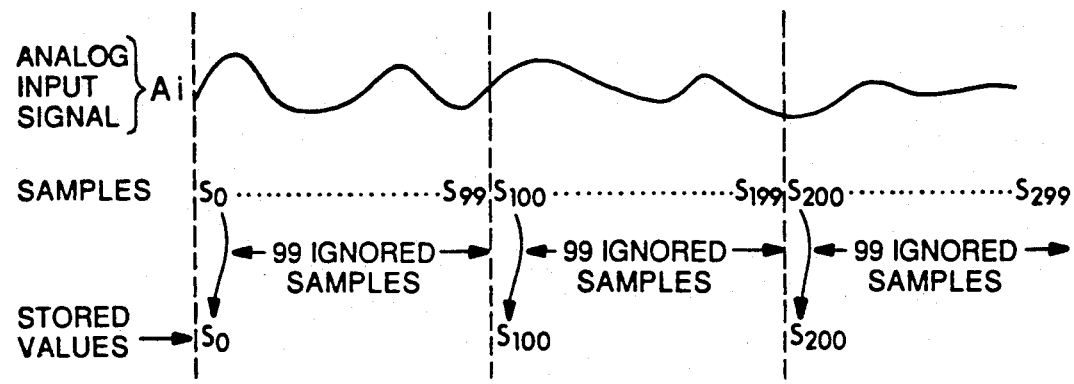
FIG. 3 is a timing diagram showing the manner in which the input signal is sampled and stored for $N = 100$ in the prior art embodiment of FIG. 2.
Figure 4:
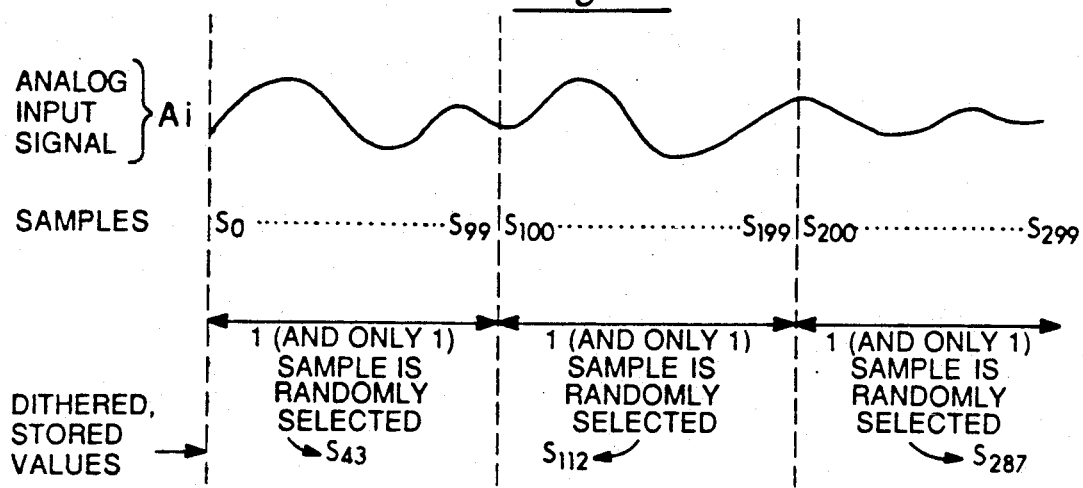
FIG. 4 is a timing diagram showing the manner in which the input signal is sampled and stored for $N = 100$ in the present invention.
Figure 6:
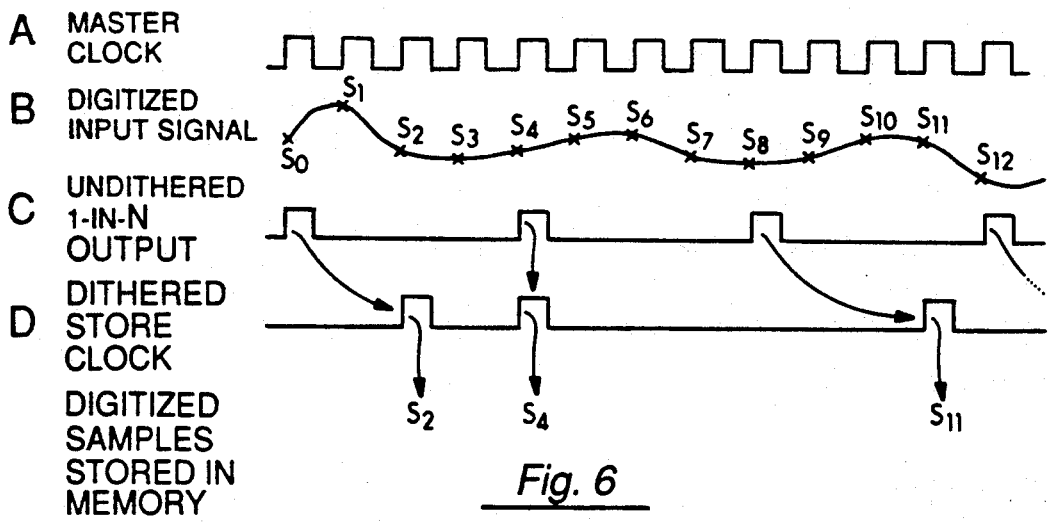
FIG. 6 is a timing diagram showing an example of sampling and storage of data for $N = 4$ in the present invention.

This may be better understood by comparing FIG. 5 (prior art, N = 4) against FIG. 6 (present invention). In the prior art shown in FIG. 5, the first sample ($S_0, S_4, S_8, \ldots$) in each successive series of four samples is stored into the memory. The interval between successive stored samples is always equal to 4 clock pulses and the effective rate of storage of samples into memory is constant at a value of $F_o/4$. In the present invention, as shown in FIG. 6, a random sample (e.g. $S_2, S_4, S_{11}, \ldots$) is selected from each successive series of four samples for storage into the memory. The interval between successive stored samples is typically not equal to 4 clock pulses, but the long-term average rate of storage of samples into memory does remain equal to $F_o/4$. A similar comparison is possible between FIG. 3 (prior art) and FIG. 4 (present invention) for N = 100.

Figure 7:
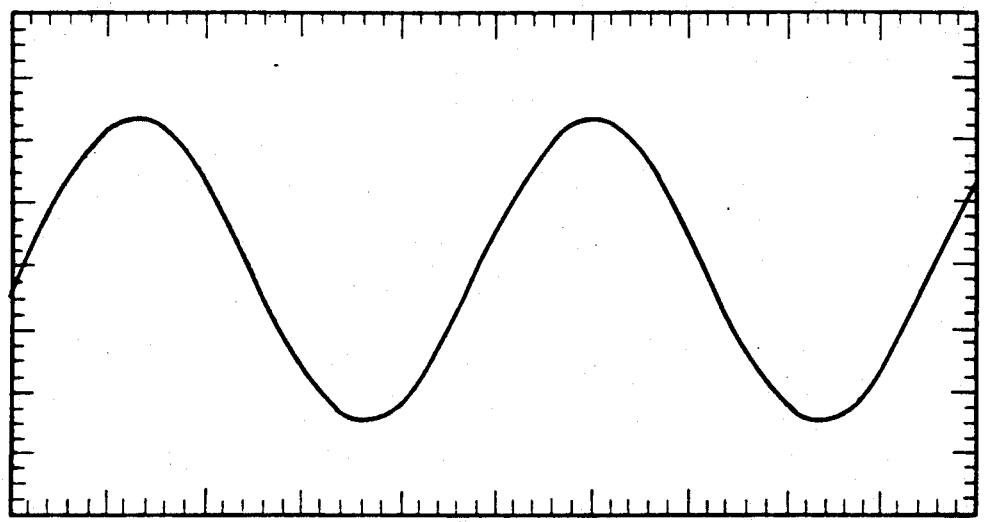
FIG. 7 is an example of erroneous data resulting from aliasing displayed on a prior art digital oscilloscope.
Figure 8:
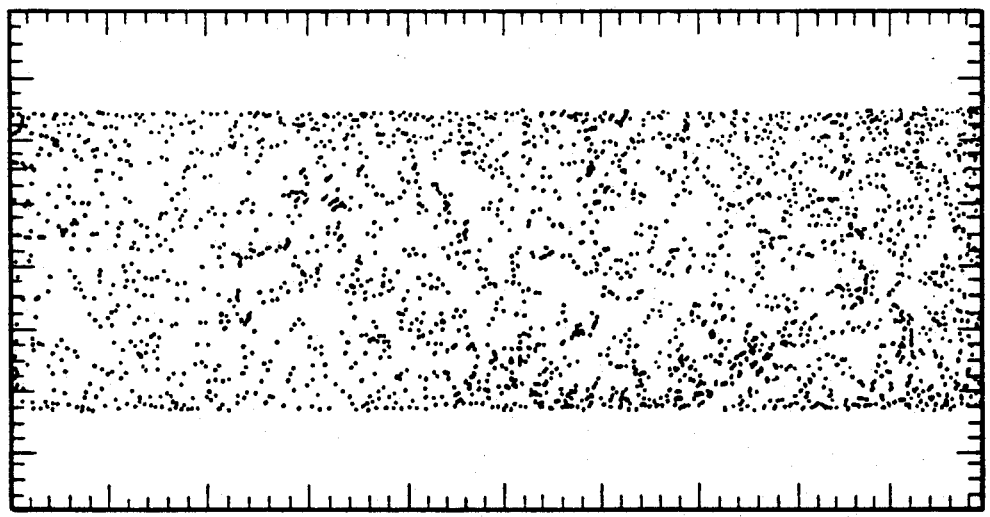
FIG. 8 is an example of corresponding display produced by a digital oscilloscope incorporating the present invention.

FIGS. 7 and 8 show an example of the differences in display provided by a prior art digital oscilloscope and the present invention. Assume the following condition:

Clock Frequency, $F_o$: 20,000,000 samples/sec.
Input signal, $A_i$: A sine wave with a frequency of $F_o/125 + 1$ (i.e., 160,001 Hz).
Oversampling Rate, N: 20,000

Thus, the input signal $A_i$ makes approximately 160k/(20M/20,000) = approximately 160 cycles per sample stored in memory for display on the screen. Therefore the output display of the oscilloscope should show a very high frequency signal. However, due to signal aliasing (caused by the 1 Hz deviation in $A_i$ from the harmonic of $F_o$), the plot shown in FIG. 7 depicts the resulting oscilloscope display without the present invention. Certainly, the user could easily be mislead into believing that the input signal $A_i$ is a low frequency signal (1 Hz). This is an utter misrepresentation of the true frequency of the input signal, by a factor of about 160,000! In contrast, FIG. 8 shows the oscilloscope display resulting from dithering the sample storage rate in accordance with the present invention. This is a much improved and desirable representation of a very high frequency input signal $A_i$.

Figure 9:
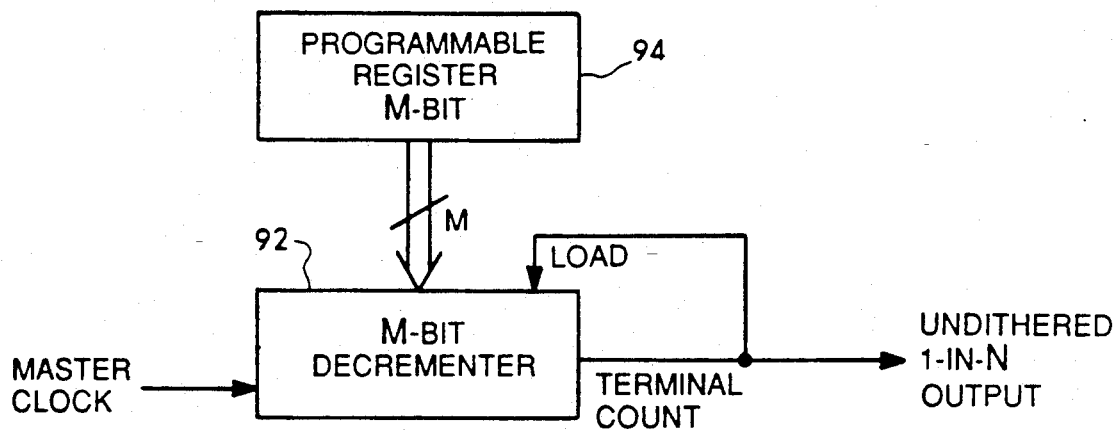
FIG. 9 is a schematic block diagram and state sequence chart providing further detail of the 1-in-N block 90 shown in FIG. 1.
Figure 10:
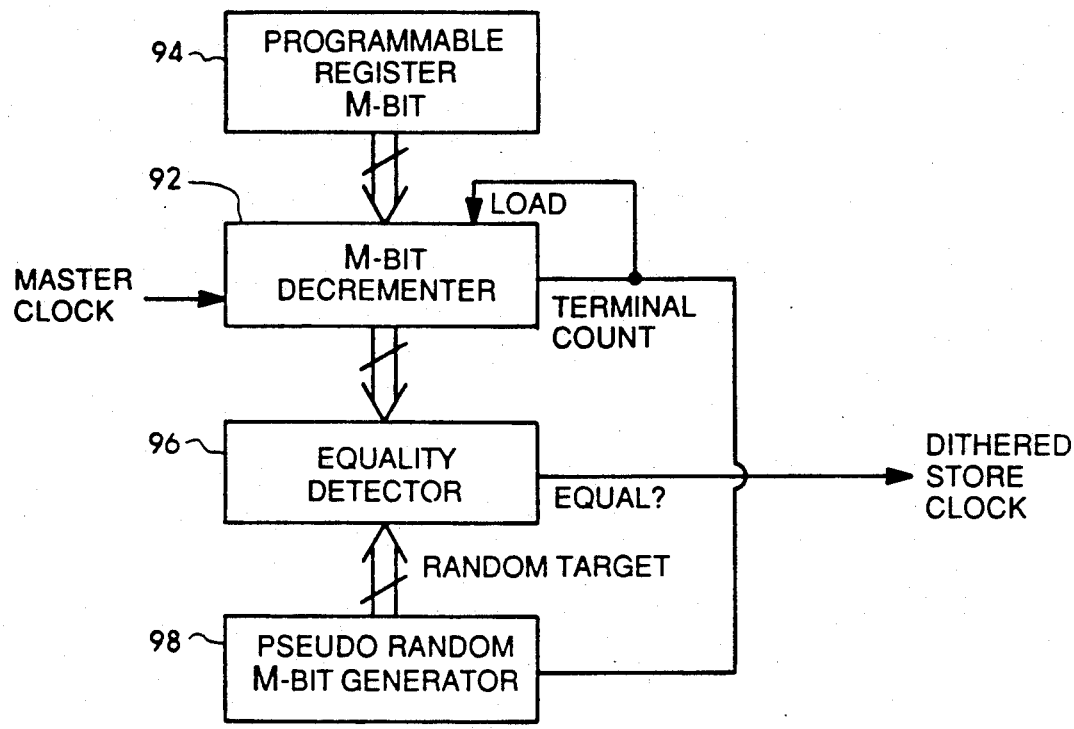
FIG. 10 is a schematic block diagram and state sequence chart detailing one embodiment of the low frequency dither block 100 shown in FIG. 1.
Figure 11:
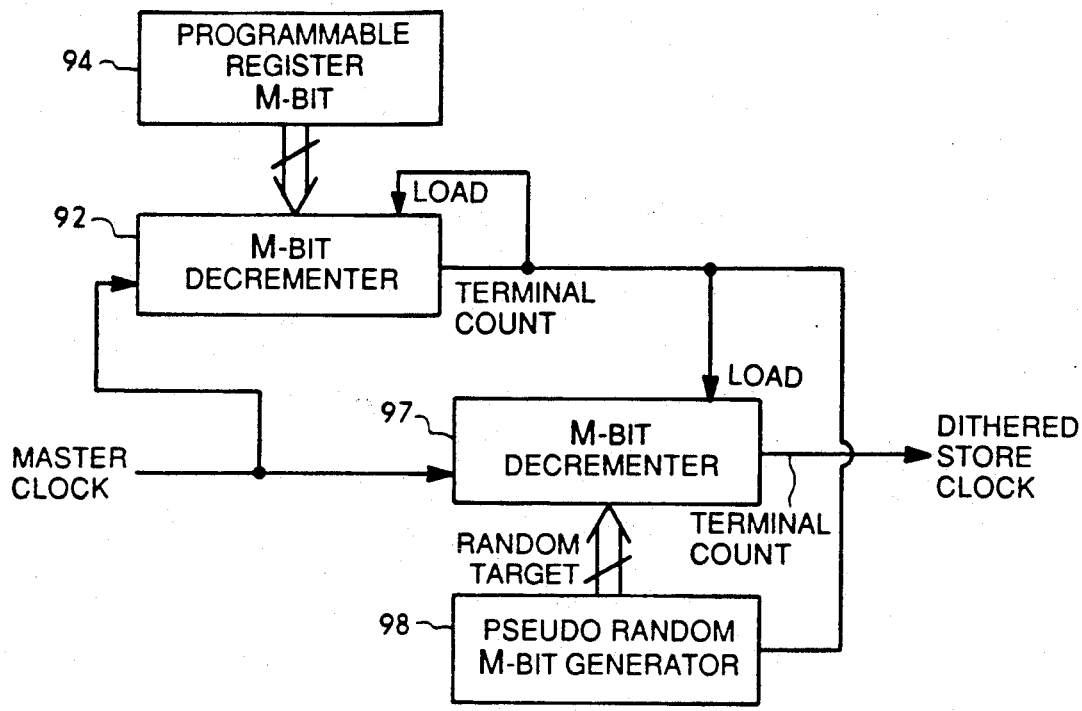
FIG. 11 is a schematic block diagram and state sequence chart detailing an alternative embodiment of the low frequency dither block 100 shown in FIG. 1.

FIGS. 9-11 show two specific alternative implementations of the low frequency dither block 100 in FIG. 1. In particular, FIG. 9 provides further detail of the 1-in-N block 90 within the low frequency dither block 100. A register 94 is programmed with a value of N − 1. The counter of conventional decrementer 92 is progressively decremented by one for each clock pulse received from the master clock 10. The terminal count of the decrementer remains at zero until the counter is decremented to zero. At that point, the terminal count equals one and causes the value of N − 1 to be loaded from the register 94 into the decrementer 92. This process is repeated for each series of N clock pulses. The terminal count signal is therefore an undithered 1-in-N signal (zero for N − 1 clock pulses, followed by one for a single clock pulse). The state sequence shown at the bottom of FIG. 9 demonstrates this process for N = 6.

The random sample select block 95 is the other remaining component of the low frequency dither block 100 in FIG. 1. FIG. 10 discloses further details of one possible implementation of the low frequency dither block 100. The decrementer 92 and programmable register 94 function as a 1-in-N block, as previously described. The pseudo-random M-bit generator 98 generates a random m-bit word (the random target) having a range between zero and N − 1, whenever triggered by the terminal count of the decrementer 92. In other words, a random target is produced and then remains constant for each series of N clock pulses. An equality detector 96 compares the random target against the counter of the decrementer 92. A one is output by the equality detector 96 if the random target equals the decrementer counter, otherwise a zero is output by the equality detector 96. This output signal from the equality detector 96 is the dithered store clock signal. FIG. 10 includes a state sequence chart demonstrating this process for N = 6. As can be seen from FIG. 10, the output signal of the equality detector 96 has a value of one for only one clock pulse in each successive series of N clock pulses as the decrementer 92 decrements from N − 1 to zero.

FIG. 11 discloses an alternative embodiment of the low frequency dither block 100. As before, the first decrementer 92 and programmable register 94 serve as a 1-in-N block 90. The pseudo-random M-bit generator 98 is used to generate a series of random targets (i.e., one random target for each series of N clock pulses, as before). A second decrementer 97 is triggered by the terminal count of the first decrementer 92 to load the current random target from the pseudo-random M-bit generator after each series of N clock pulses. The terminal count of the first decrementer 92 also triggers the pseudo-random M-bit generator to generate a new random target for later use by the second decrementer 97. The second decrementer decrements its counter (initially containing the random target) for each clock pulse. The terminal count of the second decrementer 97 changes to a value of one when its counter is decremented to zero. This terminal count is used as the dithered clock store signal. The state sequence chart included in FIG. 11 demonstrates this process for N = 6.

The above disclosure sets forth a number of embodiments of the present invention. Other arrangements or embodiments, not precisely set forth, could be practiced under the teachings of the present invention and a set forth in the following claims.

I claim:

1. A method for sampling an analog input signal and storing digital representation of said samples in a memory, said method comprising:
   generating a series of clock pulses at a predetermined frequency $F_o$;
   sampling said input signal at each clock pulse and converting said sample to a predetermined digital format;
   arbitrarily selecting one of said clock pulses from each successive series of N clock pulses (where N is a predetermined integer much greater than one) by means of the following sequence of steps for each series of N clock pulses:
   (a) generating an arbitrary target integer between zero and N − 1 and loading a counter with a digital value equal to N − 1 at the first clock pulse in each series of N clock pulses, where said target integer is typically not equal to the target integer for the previous series of N clock pulses;
   (b) decrementing said counter by one at each of the next N clock pulses; and
   (c) comparing said counter with said target integer at each clock pulse and selecting the clock pulse for which said counter equals said target integer; and
   storing the current sample in a memory at each of said selected clock pulses.

2. In an oscilloscope adapted to sample an analog input signal, store digital values representative of said samples in a memory, and display a visual representation of said input signal by plotting said stored values along a predetermined axis, a method of sampling and storing said samples comprising:
   generating a series of clock pulses having a predetermined frequency $F_o$;
   sampling said analog input signal at each clock pulse and converting each of said samples to a predetermined digital format suitable for storage in said memory;
   randomly selecting one of said clock pulses from each successive series of N clock pulses, where N is an integer much greater than one, by means of the following sequences of steps for each series of N clock pulses:
   (a) generating a random integer between zero and N − 1 and loading a counter with a digital value equal to N − 1 at the first clock pulse in each series of N clock pulses;
   (b) decrementing said counter by one at each of the next N clock pulses; and
   (c) comparing said counter with said random integer at each clock pulse and selecting the clock pulse for which said counter equals said random integer;
   storing the current sample in a memory at each of said selected clock pulses; and
   displaying said stored samples in said visual representation after a predetermined number of samples have been stored in said memory.

3. An oscilloscope adapted to sample an analog input signal, store digital values representative of said samples in a memory, and display a visual representation of said input signal by plotting said stored values along a predetermined axis, said oscilloscope comprising:
   a clock producing a series of electrical pulses at a predetermined frequency;
   an analog-to-digital ("A/D") converter adapted to sample said analong input signal and produce a digital output value that is a digital representation of said analog input signal at each of said clock pulses;
   a memory adapted to receive said digital output value from said A/D converter, and to store said digital output value when triggered by a control signal;
   sample selection means having:
   (a) a 1-in-N block adapted to count said clock pulses and produce one output pulse for each series of N clock pulses;
   (b) a random number generator adapted to generate a random digital value between zero and N − 1, said random value changing after each output pulse from said 1-in-N block; and
   (c) a decrementer adapted to load said random value from said random number generator in response to each output pulse from said 1-in-N block, thereafter progressively decrement said random value for each clock pulse, and trigger said memory when said decremented random value reaches zero; and display means adapted to create said visual representation of said stored samples after a predetermined number of samples have been stored in said memory.

4. The apparatus of claim 3, wherein said apparatus is part of a digital oscilloscope adapted to display a visual representation of said analog input signal by plotting a predetermined number of points P along a predetermined axis with said visual representation being updated at a rate of S sweeps along said axis per unit time; and wherein N is an integer substantially equal to $F_o/(S * P)$.

5. The apparatus of claim 3, wherein said 1-in-N block comprises a decrement having a counter adapted to decrement from N − 1 to zero for each series of N clock pulses; said decrementer being further adapted to produce said output pulse when said counter reaches zero.

6. An apparatus for sampling an analog input signal and storing digital representations of said samples, said apparatus comprising:

a clock producing a series of electrical pulses at a predetermined frequency, $F_o$;

an analog-to-digital ("A/D") converter adapted to sample said analog input signal and produce a digital output value in response to each of said clock pulses that is a digital representation of said analog input signal;

a memory adapted to receive said digital output value from said A/D converter and to store a plurality of said digital output value, said memory storing the current digital output value from said A/D converter when triggered by a control signal; and sample selection means having:
(a) a 1-in-N block adapted to count said clock pulses and produce one output pulse for each series of N clock pulses;
(b) a random number generator adapted to generate a random digital value between zero and N − 1, said random value changing after each output pulse from said 1-in-N block; and
(c) a decrementer adapted to load said random value from said random number generator in response to each output pulse from said 1-in-N block, thereafter progressively decrement said random value for each clock pulse, and trigger said memory when said decremented random value reaches zero.

7. The apparatus of claim 6, wherein said apparatus is part of a digital oscilloscope adapted to display a visual representation of said analog input signal by plotting a predetermined number of points P along a predetermined axis with said visual representation being updated at a rate of S sweeps along said axis per unit time; and wherein N is an integer substantially equal to $F_o/(S * P)$.

8. An apparatus for sampling an analog input signal and storing digital representation of said samples, said apparatus comprising:

a clock producing a series of electrical pulses at a predetermined frequency, $F_o$;

an analog-to-digital ("A/D") converter adapted to sample said analog input signal and produce a digital output value in response to each of said clock pulses that is a digital representation of said analog input signal;

a memory adapted to receive said digital output values from said A/D converter and to store a plurality of said digital output values, said memory storing the current digital output value from said A/D converter when triggered by a control signal; and sample selection means having:
(a) a decrementer adapted to receive said clock pulses, having a counter adapted to decrement from a digital value of N − 1 to zero for each successive series of N clock pulses (where N is a predetermined integer much greater than one);
(b) a random number generator adapted to generate a random digital value between zero and N − 1, said random value changing once for each of said series of N clock pulses; and
(c) an equality detector adapted to trigger said memory when said random value equals the value of said decrementer counter.

9. The apparatus of claim 8, wherein said apparatus is part of a digital oscilloscope adapted to display a visual representation of said analog input signal by plotting a predetermined number of points P along a predetermined axis with said visual representation being updated at a rate of S sweeps along said axis per unit time; and wherein N is an integer substantially equal to $F_o/(S * P)$.

10. An apparatus for sampling an analog input signal and storing digital representations of said samples, said apparatus comprising:

a clock producing a series of electrical pulses at a predetermined frequency, $F_o$;

an analog-to-digital ("A/D") converter adapted to sample said analog input signal and produce a digital output value in response to each of said clock pulses that is a digital representation of said analog input signal;

a memory adapted to receive said digital output values from said A/D converter and to store a plurality of said digital output values, said memory storing the current digital output value from said A/D converter when triggered by a control signal; and sample selection means having:
(a) a first decrementer adapted to receive said clock pulses, having a counter adapted to progressively decrement from a digital value of N − 1 to zero for each series of N clock pulses (where N is a predetermined integer greater than one), and to produce an output pulse when said counter reaches zero;
(b) a random number generator adapted to generate a random digital value between zero and N − 1, said random value changing after each output pulse from said first decrementer; and
(c) a second decrementer adapted to receive said clock pulses, and having a counter adapted to load said random value from said random number generator in response to each output pulse from said first decrementer; said second decrementer thereafter progressively decrementing said random value for each clock pulse, and triggering said memory when said counter reaches zero.

11. The apparatus of claim 10, wherein said apparatus is part of a digital oscilloscope adapted to display a visual representation of said analog input signal by plotting a predetermined number of points P along a predetermined axis with said visual representation being updated at a rate of S sweeps along said axis per unit time; and wherein N is an integer substantially equal to $F_o/(S * P)$.

* * * * *